(12) United States Patent
Namatsu

(10) Patent No.: US 6,576,066 B1
(45) Date of Patent: Jun. 10, 2003

(54) SUPERCRITICAL DRYING METHOD AND SUPERCRITICAL DRYING APPARATUS

(75) Inventor: Hideo Namatsu, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 205 days.

(21) Appl. No.: 09/724,684

(22) Filed: Nov. 28, 2000

(30) Foreign Application Priority Data

Dec. 6, 1999 (JP) .......................................... 11-346205
May 8, 2000 (JP) ...................................... 2000-134441

(51) Int. Cl.$^7$ ................................................ B08B 3/00
(52) U.S. Cl. ................................ 134/30; 134/2; 134/3; 134/11; 134/26; 134/28; 134/31; 134/34; 134/36; 134/41; 134/902; 438/906; 34/443; 34/448; 34/516
(58) Field of Search ............................ 134/2, 3, 10, 11, 134/30, 31, 28, 34, 36, 26, 37, 29, 41, 902; 438/906; 34/443, 448, 516

(56) References Cited

U.S. PATENT DOCUMENTS

| | | | |
|---|---|---|---|
| 5,370,742 A | * 12/1994 | Mitchell et al. | ............... 134/10 |
| 5,700,379 A | 12/1997 | Biebl | |
| 6,067,728 A | 5/2000 | Farmer et al. | |
| 6,092,538 A | * 7/2000 | Arai et al. | .................... 134/1.3 |
| 6,334,266 B1 | * 1/2002 | Moritz et al. | ................ 118/725 |

FOREIGN PATENT DOCUMENTS

| | | |
|---|---|---|
| EP | 0 822 583 A2 | 4/1998 |
| JP | 5-299336 | 11/1993 |
| JP | 6-196472 | * 7/1994 |
| JP | 10-102088 | 4/1998 |

OTHER PUBLICATIONS

Namatsu, "Dimensional limitations of silicon nanolines resulting from pattern distortion due to surface tension of rinse water," Appl. Phys. Lett. 66 (20) pp 2655–2657, May 15, 1995.

* cited by examiner

Primary Examiner—Randy Gulakowski
Assistant Examiner—M. Kornakov
(74) Attorney, Agent, or Firm—Townsend and Townsend and Crew LLP; Kenneth R. Allen

(57) ABSTRACT

According to a supercritical drying method of this invention, a substrate having a pattern is dipped in water and rinsed with water. Then, the substrate is placed in the reaction chamber of a predetermined sealable vessel, and surfactant-added liquid carbon dioxide is introduced into the reaction chamber. The substrate is dipped in surfactant-added liquid carbon dioxide, and liquid carbon dioxide is changed to the supercritical state. After that, supercritical carbon dioxide is gasified.

24 Claims, 7 Drawing Sheets

FIG. 5A
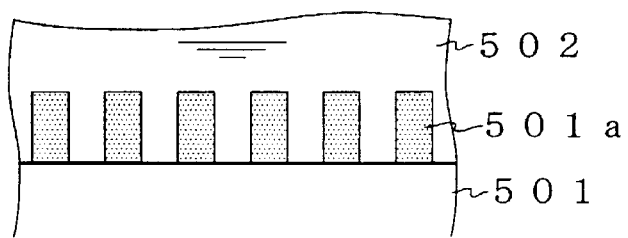
FIG. 5B
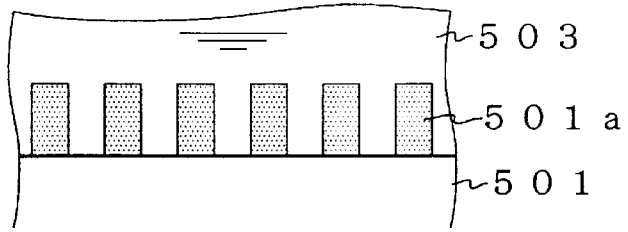
FIG. 5C
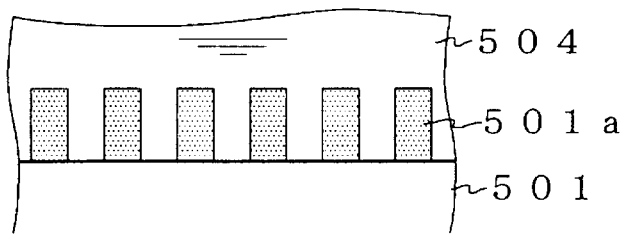
FIG. 5D
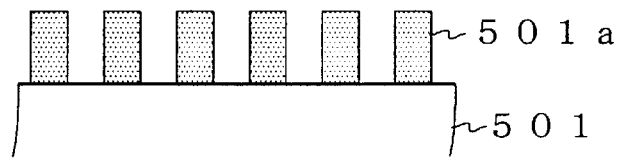
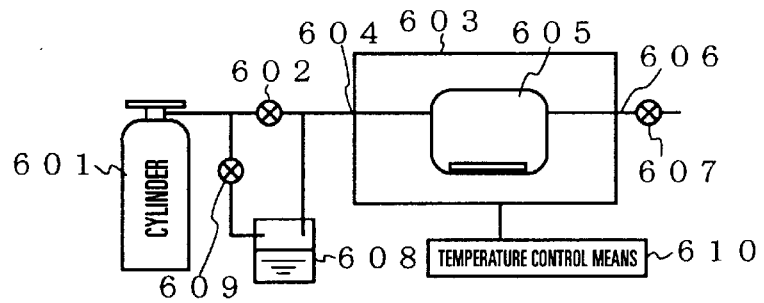
FIG. 6

SUPERCRITICAL DRYING METHOD AND SUPERCRITICAL DRYING APPARATUS

BACKGROUND OF THE INVENTION

The present invention relates to a supercritical drying method and supercritical drying apparatus for suppressing collapse of a fine pattern caused by the surface tension of a rinse solution in drying after rinse processing using water.

Recently, as MOS LSIs become larger, chips become larger, and patterns in the manufacture of LSIs become finer. At present, patterns having line widths smaller than 100 nm can be formed. The decrease in line width enables forming a pattern having a high aspect ratio (height/width). Fabricating large-scale, high-performance devices such as LSIs requires hyperfine patterns.

This hyperfine pattern includes, e.g., a resist pattern photosensitive to light, X-rays, or an electron beam that is formed through exposure, developing, and rinse processing. Further, the hyperfine pattern includes an etching pattern made of an inorganic material such as an oxide that is formed through etching, water rinsing, and rinse processing by selective etching using a resist pattern as a mask. The resist pattern can be formed by processing a photosensitive resist film of an organic material by lithography. When the photosensitive resist film is exposed, the molecular weight or molecular structure in the exposed region changes to generate a difference in solubility in a developing solution between the exposed region and an unexposed region. Developing processing using this difference can form a pattern finer than the photosensitive resist film.

If this developing processing continues development, the unexposed region also starts dissolving in the developing solution, and the pattern disappears. To prevent this, rinse processing using a rinse solution is performed to stop developing. Finally, the pattern is dried to remove the rinse solution, thereby forming the resist pattern as a processed mask on the resist film.

A serious problem in drying in forming a fine pattern is pattern collapse as shown in FIGS. 11A to 11C.

A fine resist pattern having a high aspect ratio is formed through rinse cleaning and drying after development. A fine pattern having a high aspect ratio is also formed from a material other than the resist. For example, when a substrate pattern having a high aspect ratio is to be formed by etching a substrate using a resist pattern as a mask, the substrate is cleaned after etching, and a substrate pattern 1102 is dipped in and rinsed with water 1103 together with a substrate 1101, as shown in FIG. 11A. After that, the substrate pattern 1102 is dried.

However, as shown in FIG. 11B, a bending force (capillary force) 1105 acts in drying due to the pressure difference between the water 1103 left in the substrate pattern 1102 and external air 1104. As a result, as shown in FIG. 11C, pattern collapse of the substrate pattern 1102 occurs on the substrate 1101. The collapse phenomenon becomes prominent for a pattern having a higher aspect ratio. The capillary force is reported to depend on the surface tension of the rinse solution, such as water, remaining between patterns (reference: Applied Physics Letters, Vol. 66, pp. 2655–2657, 1995).

This capillary force not only collapses a resist pattern made of an organic material, but also distorts a stronger pattern made of an inorganic material such as silicon. Therefore, the problem of capillary force caused by the surface tension of the rinse solution is serious. The problem due to the capillary force can be solved by processing using a rinse solution whose surface tension is low. For example, when water is used as a rinse solution, the surface tension of water is about $72 \times 10^{-3}$ N/m. On the other hand, the surface tension of methanol is about $23 \times 10^{-3}$ N/m. Pattern collapse is, therefore, suppressed when ethanol is dried after water is substituted by ethanol, compared to direct water drying.

Pattern collapse is more effectively suppressed when perfluorocarbon having a surface tension of $20 \times 10^{-3}$ N/m is used, a rinse solution is substituted by a perfluorocarbon solution, and then perfluorocarbon is dried. Although generation of pattern collapse can be reduced using a rinse solution having a low surface tension, pattern collapse cannot be eliminated using a liquid because the liquid has surface tension to a certain extent. To eliminate pattern collapse, a rinse solution whose surface tension is 0 is used, or a rinse solution is substituted by a liquid whose surface tension is 0 and then the substituted liquid is dried.

An example of the liquid whose surface tension is 0 is a supercritical fluid. The supercritical fluid is a substance at a temperature and pressure exceeding the critical temperature and critical pressure. The supercritical fluid has a dissolving power almost equal to that of a liquid, but exhibits a tension and viscosity almost equal to those of a gas. The supercritical fluid can be said to be a liquid which maintains a gaseous state. Since the supercritical fluid does not form any gas-liquid interface, its surface tension is 0. Hence, drying in the supercritical state is free from any concept of surface tension, and pattern collapse does not occur.

The supercritical fluid has both diffusion of a gas and solubility (high density) of a liquid, and can change in state from a liquid to a gas without the mediacy of any equilibrium line. If the supercritical fluid is gradually discharged in a state in which the supercritical fluid is filled, no liquid-gas interface is formed, and a pattern can be dried without any surface tension acting on a hyperfine pattern to be dried.

The supercritical fluid has been used for 10 years originally as an impurity extraction means. For example, the supercritical fluid is used as a caffeine extraction medium in a plant where caffeine is extracted from coffee. Since the solubility of the supercritical fluid changes by a set pressure for obtaining the supercritical state, the pressure can be changed to easily adjust the solubility to a substance to be extracted. For this reason, the supercritical fluid is used for extraction of caffeine. Extraction using a supercritical fluid such as carbon dioxide need not discharge any solvent waste in comparison with extraction using an organic solvent, and is evaluated as an easy-to-use extraction means. At present, supercritical extraction has been studied and put into practical use.

As a supercritical fluid, carbon dioxide which is low in critical point and safe in many cases is used. When the supercritical fluid is used for drying, a rinse solution in which a substrate surface is dipped at room temperature or less is substituted by liquid carbon dioxide in a sealed vessel, and drying starts. Since carbon dioxide liquefies at room temperature at a pressure of about 6 MPa, this substitution is done by increasing the internal pressure of the vessel to about 6 MPa. After the substrate is completely covered with liquid carbon dioxide, the interior of the vessel is set to a temperature and pressure equal to or higher than the critical point of carbon dioxide (critical point of carbon dioxide; 31° C., 7.3 MPa), and liquid carbon dioxide is converted into supercritical carbon dioxide.

Finally, part of the vessel is opened to externally discharge supercritical carbon dioxide, the interior of the vessel is reduced to the atmospheric pressure, and supercritical carbon dioxide in the vessel is gasified to end drying. In pressure reduction, carbon dioxide does not liquefy but gasifies, so no gas-liquid interface on which surface tension acts is formed on the substrate. For this reason, hyperfine patterns on the substrate can be dried without any collapse.

An example of the supercritical drying apparatus is an apparatus constituted by connecting a cylinder 1203 storing liquid carbon dioxide via a valve 1204 to a reaction chamber 1202 in a sealable vessel 1201, as shown in FIG. 12. In this apparatus, the valve 1204 on the liquid carbon dioxide inlet side is opened to introduce liquid carbon dioxide into the reaction chamber 1202, and a valve 1205 on the discharge side is adjusted to limit the amount of liquid carbon dioxide discharged from the reaction chamber 1202, thereby controlling the internal pressure of the reaction chamber 1202.

While liquid carbon dioxide is directly introduced from the cylinder 1203 into the reaction chamber 1202, the vessel 1201 is heated to, e.g., about 31° C., the valve 1205 is adjusted to decrease the amount of liquid carbon dioxide discharged from the reaction chamber 1202, and the pressure of the reaction chamber 1202 is set to 7.38 MPa or more. Then, liquid carbon dioxide in the reaction chamber 1202 changes to the supercritical state. After that, the valve 1204 is closed, and the valve 1205 is opened to decrease the internal pressure of the reaction chamber 1202. Supercritical carbon dioxide in the reaction chamber 1202 is gasified to end supercritical drying.

As shown in FIG. 13, a pressure pump 1206 can be arranged between the cylinder 1203 and the valve 1204 to control the internal pressure of the vessel 1201 to be higher.

Generally in a pattern formation process by photolithography, a substrate is often rinsed with water and dried at last. However, since water hardly dissolves in liquid carbon dioxide, water is substituted by ethanol which is relatively easily miscible with carbon dioxide, and then supercritical drying is executed. Although ethanol is miscible, the solubility of carbon dioxide and an alcohol such as ethanol is insufficient, and substitution requires a long time. Further, some resists dissolve in alcohols, so no alcohol can be used after water rinsing.

SUMMARY OF THE INVENTION

It is, therefore, the principal object of the present invention to enable drying while suppressing generation of pattern collapse.

To achieve the above object, according to one aspect of the present invention, a pattern layer having a predetermined pattern formed on a substrate is exposed to water. While water attaches to the pattern layer, the pattern layer is exposed to a predetermined liquid to emulsify water attached to the pattern layer with the liquid, thereby obtaining a state in which the liquid attaches to the pattern layer. The liquid attached to the pattern layer is substituted by a liquid of a nonpolar substance which is gaseous in the atmosphere. Then, the nonpolar substance attached to the pattern is changed to the supercritical state, and the supercritical nonpolar substance attached to the pattern layer is gasified.

According to the present invention, water attached to the pattern layer formed on the substrate is substituted by the liquid. In attaching the liquid of the nonpolar substance to the pattern layer, no water attaches to the pattern layer.

According to another aspect of the present invention, a pattern layer having a predetermined pattern formed on a substrate is exposed to water. While water attaches to the pattern layer, the pattern layer is exposed to an alcohol liquid to dissolve water attached to the pattern layer in the alcohol liquid, thereby obtaining a state in which the alcohol liquid attaches to the pattern layer. While the alcohol liquid attaches to the pattern layer, the pattern layer is exposed to an aliphatic hydrocarbon liquid to dissolve the alcohol liquid attached to the pattern layer in the aliphatic hydrocarbon liquid, thereby attaining a state in which the aliphatic hydrocarbon liquid attaches to the pattern layer. While the aliphatic hydrocarbon liquid attaches to the pattern layer, the pattern layer is exposed to a liquid of a nonpolar substance which is gaseous in the atmosphere. The aliphatic hydrocarbon liquid attached to the pattern layer is dissolved in the liquid of the nonpolar substance to set a state in which the liquid of the nonpolar substance attaches to the pattern layer. Then, the nonpolar substance attached to the pattern is changed to the supercritical state, and the supercritical nonpolar substance attached to the pattern layer is gasified.

According to the present invention, alcohol attached to the pattern layer formed on the substrate is substituted by an aliphatic hydrocarbon. In attaching the liquid of the nonpolar substance to the pattern layer, the aliphatic hydrocarbon attaches to the pattern layer.

According to still another aspect of the present invention, a pattern layer having a predetermined pattern formed on a substrate is expose to water. While water attaches to the pattern layer, the pattern layer is exposed to a nonpolar aliphatic hydrocarbon liquid to emulsify water-attached to the pattern layer with the aliphatic hydrocarbon liquid, thereby obtaining a state in which the aliphatic hydrocarbon liquid attaches to the pattern layer. While the aliphatic hydrocarbon liquid attaches to the pattern layer, the pattern layer is exposed to a liquid of a nonpolar substance which is gaseous in the atmosphere. The aliphatic hydrocarbon liquid attached to the pattern layer is dissolved in the liquid of the nonpolar substance to attain a state in which the liquid of the nonpolar substance attaches to the pattern layer. After that, the nonpolar substance attached to the pattern is changed to the supercritical state, and the supercritical nonpolar substance attached to the pattern layer is gasified.

According to the present invention, water attached to the pattern layer formed on the substrate is substituted by an aliphatic hydrocarbon. In attaching the liquid of the nonpolar substance to the pattern layer, the aliphatic hydrocarbon attaches to the pattern layer.

According to still another aspect of the present invention, as the first step, a pattern layer having a predetermined pattern formed on a substrate is exposed to water. As the second step, while water attaches to the pattern layer, the pattern layer is exposed to a liquid of a nonpolar substance which is gaseous in the atmosphere, and water attached to the pattern layer is emulsified with the liquid of the nonpolar substance. As the third step, the nonpolar substance attached to the pattern layer is changed to the supercritical state. Finally as the fourth step, the supercritical nonpolar substance attached to the pattern layer is gasified.

According to the present invention, water attached to the pattern layer is substituted by the liquid of the surfactant-added nonpolar substance, and the nonpolar substance gasifies on the surface of the pattern layer after changing to the supercritical state. In drying the pattern layer, no surface tension is generated on the gas-liquid interface.

A supercritical drying apparatus according to the present invention comprises a sealable vessel having a reaction chamber for placing a substrate to be processed, nonpolar substance supply means for supplying a liquid of a nonpolar substance which is gaseous in the atmosphere to the reaction chamber, surfactant addition means for adding a surfactant to the nonpolar substance supplied to the reaction chamber, discharge means for discharging a fluid introduced into the reaction chamber, control means for controlling the internal pressure of the reaction chamber until the nonpolar substance changes to the supercritical state, and temperature control means for controlling the internal temperature of the reaction chamber to a predetermined temperature.

According to the present invention, the liquid of the surfactant-added nonpolar substance is supplied to the reaction chamber, and the nonpolar substance supplied to the reaction chamber changes to the supercritical state.

BRIEF DESCRIPTION OF THE DRAWINGS

FIGS. 5A to 5D are sectional views for explaining a supercritical drying method according to Embodiment 2 of the present invention;

FIG. 6 is a view showing the arrangement of a supercritical drying apparatus for performing the supercritical drying method according to Embodiment 2 of the present invention;

FIGS. 7A to 8D are sectional views for explaining another example of the supercritical drying method according to Embodiment 2 of the present invention;

DESCRIPTION OF THE PREFERRED EMBODIMENTS

Embodiments of the present invention will be described in detail below with reference to the accompanying drawings.

Embodiment 1

Embodiment 1 of the present invention will be explained.

This embodiment sets a state in which an aliphatic hydrocarbon as a nonpolar solvent such as n-hexane (normal hexane) attaches to a pattern surface before supercritical drying. The aliphatic hydrocarbon means one which is liquid in the atmosphere, e.g., an atmospheric state at 20 to 30° C.

Figure 11A:
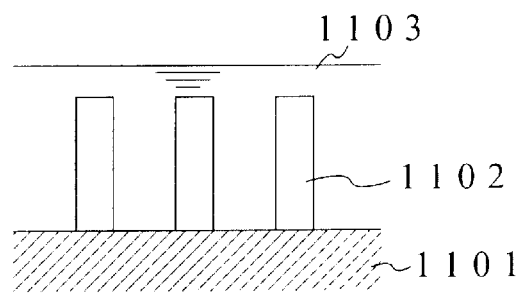
FIGS. 11A to 11C are sectional views for explaining surface tension acting on a gas-liquid interface.
Figure 11B:
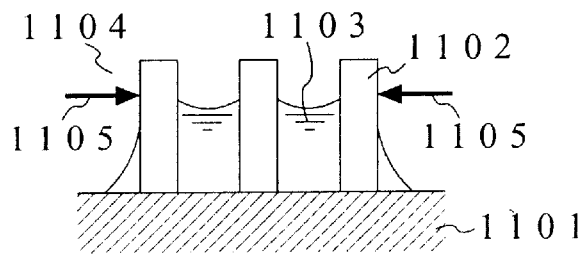
Figure 11C:
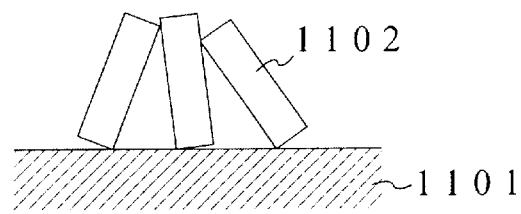
Figure 12:
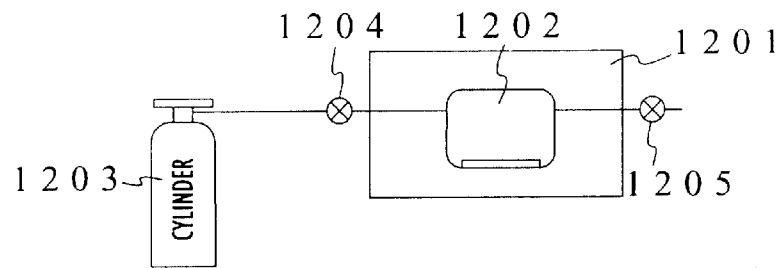
FIG. 12 is a view showing the arrangement of a conventional supercritical drying apparatus.
Figure 13:
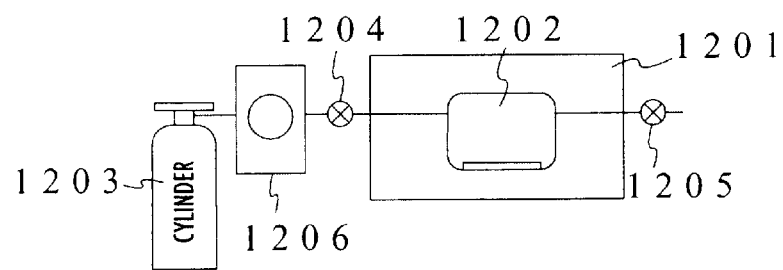
FIG. 13 is a view showing the arrangement of another conventional supercritical drying apparatus.

As described above, in supercritical drying using carbon dioxide, carbon dioxide used as a supercritical fluid has no polarity and low solubility in alcohol having a polarity. Even if attaching alcohol is to be substituted by liquid carbon dioxide in order to supercritically dry a fine pattern to which the alcohol attaches, the alcohol cannot be completely or perfectly substituted, and remains in a region. In the region where the alcohol remains, no supercritical drying is done, and pattern collapse as shown in FIGS. 11A to 11C occurs.

To the contrary, if a target to be substituted by liquid carbon dioxide is a nonpolar aliphatic hydrocarbon, the aliphatic hydrocarbon has high solubility in carbon dioxide, it is suppressed that alcohol is not completely substituted by liquid carbon dioxide or remains. No pattern collapse occurs. From this, pattern collapse can be greatly suppressed by rinsing a substrate to be dried with a nonpolar aliphatic hydrocarbon and performing supercritical drying using carbon dioxide. Similar results also arise when the PMMA films in which alcohol remains are treated with supercritical carbon dioxide. The problem is also solved by the gradual substitution of alcohol on/in the film with aliphatic hydrocarbon solvents. Note than an aliphatic hydrocarbon having a lower molecular weight exhibits higher compatibility with liquid carbon dioxide, so that n-hexane, n-heptane, and cyclohexane are suitable.

EXAMPLE 1

Figure 1:
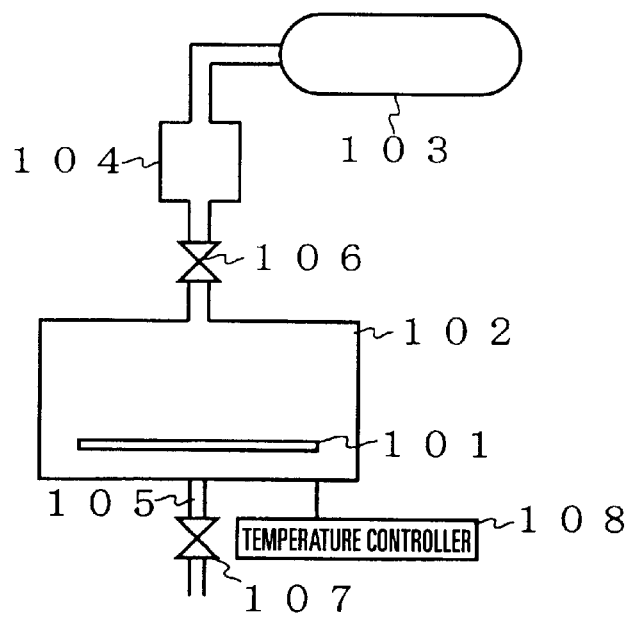
FIG. 1 is a view showing the arrangement of a supercritical drying apparatus for performing a supercritical drying method according to Embodiment 1 of the present invention.

A supercritical drying apparatus for performing supercritical drying will be described. In the supercritical drying apparatus, as shown in FIG. 1, a substrate 101 to be processed is fixed to and processed in a reaction chamber 102 where supercritical drying is performed. The reaction chamber 102 comprises a liquid carbon dioxide cylinder 103 connected to the reaction chamber 102 via a pump unit 104. The reaction chamber 102 further comprises a discharge pipe 105, and a valve 106 arranged between the pump unit 104 and the reaction chamber 102. In addition, a pressure control valve 107 for automatically controlling the internal pressure of the reaction chamber 102 is arranged midway along the discharge pipe 105. The internal temperature of the reaction chamber 102 is controlled by a temperature controller 108.

Supercritical drying of Example 1 using the supercritical drying apparatus will be explained.

Figure 2A:
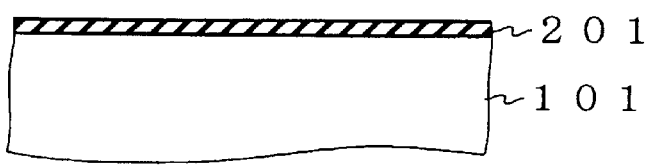
FIGS. 2A to 2C are sectional views for explaining Example 1 of the supercritical drying method according to Embodiment 1 of the present invention.
Figure 2B:
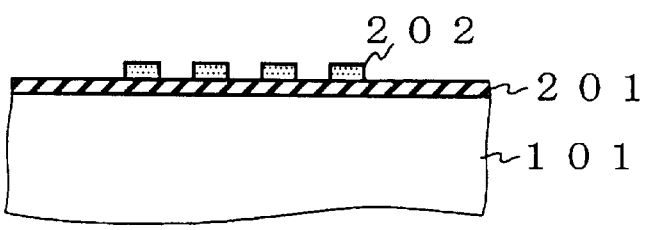
Figure 2C:
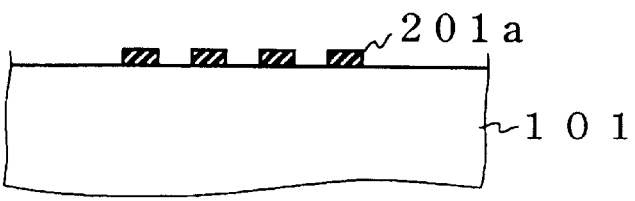

As shown in FIG. 2A, the surface of a silicon substrate 101 having a (110) plane was thermally oxidized to form an oxide film 201 to a film thickness of about 30 nm. As shown in FIG. 2B, thin resist patterns 202 were formed on the oxide film 201. The resist patterns 202 were formed by known lithography with a width of about 30 nm at an interval of 30 nm. After the oxide film 201 was dry-etched using the resist patterns 202 as a mask, the resist patterns 202 were removed to form mask patterns 201a made of a silicon oxide on the substrate 101, as shown in FIG. 2C.

Figure 3A:
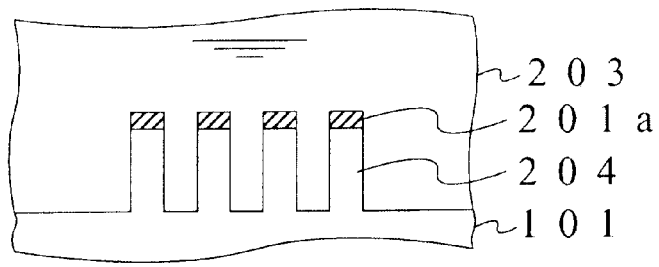
FIGS. 3A to 3F are sectional views for explaining Example 1 subsequent to FIGS. 2A to 2C.

As shown in FIG. 3A, the substrate 101 was dipped in an aqueous potassium hydroxide solution 203 to etch the substrate 101 using the mask patterns 201a as a mask. Since the surface of the silicon substrate 101 had a (110) plane, etching with the aqueous potassium hydroxide a solution 203 progressed only in a direction perpendicular to the surface of the substrate 101. Hence, as shown in FIG. 3A, rectangular patterns 204 whose section was vertically elongated were formed on the substrate 101.

Figure 3B:
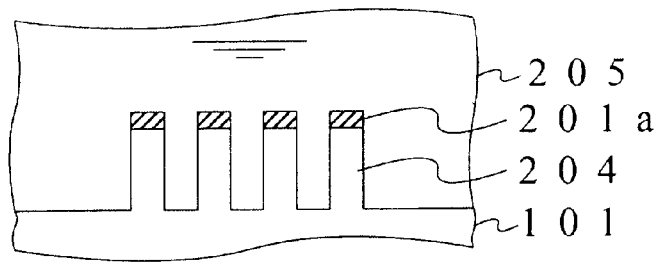

When the height of each pattern 204 reached about 150 nm, the substrate 101 was dipped in water 205 to stop etching and rinse the substrate 101 with water, as shown in FIG. 3B.

Figure 3C:
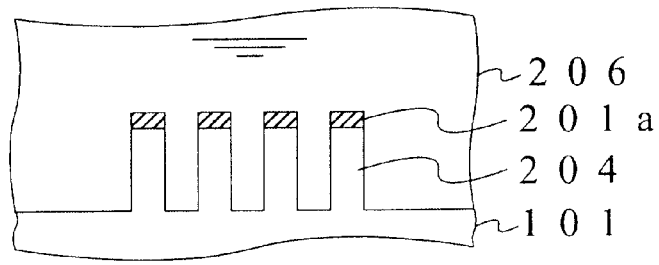

The reaction chamber 102 shown in FIG. 1 was filled with ethanol, and the water-rinsed substrate 101 was introduced into the reaction chamber 102 before the surface of the substrate 101 was dried. Then, the reaction chamber 102 was sealed. As shown in FIG. 3C, the substrate 101 was dipped in ethanol 206 to substitute water left on the surface of the pattern 204 with the ethanol 206.

Figure 3D:
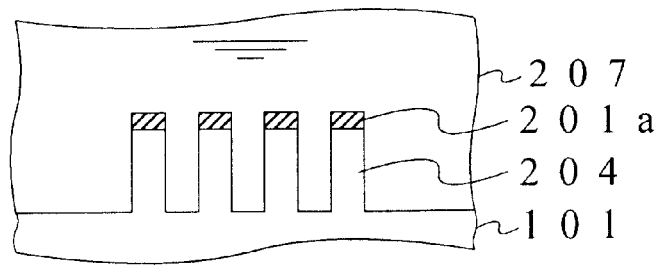

N-hexane was introduced into the reaction chamber 102, ethanol was discharged, and the reaction chamber 102 was filled with n-hexane. As shown in FIG. 3D, the substrate 101 was dipped in n-hexane 207, and the periphery of the pattern 204 was dipped in the n-hexane 207. In this state, ethanol left around the pattern 204 was substituted by the n-hexane 207.

Figure 3E:
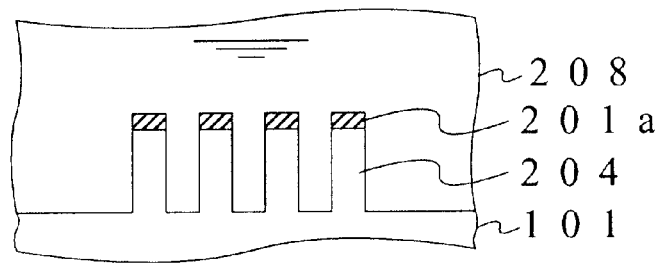

Liquid carbon dioxide was introduced from the cylinder 103 shown in FIG. 1 into the reaction chamber 102, and the substrate 101 was dipped in liquid carbon dioxide 208, as shown in FIG. 3E. As a result, the pattern 204 was dipped in the liquid carbon dioxide 208.

Figure 3F:
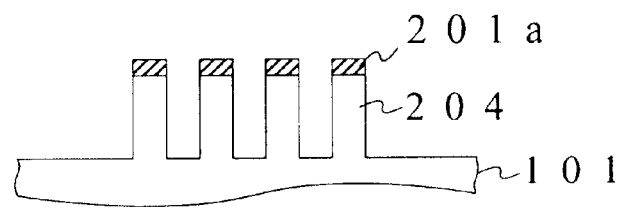

Thereafter, the supply pressure of liquid carbon dioxide by the pump unit 104, the discharge amount of carbon dioxide from the reaction chamber 102 by the pressure control valve 107, and the internal temperature of the reaction chamber 102 by the temperature controller 108 were adjusted. The internal pressure of the reaction chamber 102 was set to 7.5 MPa and the internal temperature of the reaction chamber 102 was set to 35° C. Accordingly, carbon dioxide in the reaction chamber 102 changed to the supercritical state. After carbon dioxide in the reaction chamber 102 changed to the supercritical state, supercritical carbon dioxide in the reaction chamber 102 was discharged at 1 l/m, and the substrate 101 in the reaction chamber 102 was dried. As a result, as shown in FIG. 3F, the fine silicon pattern 204 having a width of about 30 nm and a height of 150 nm could be formed on the substrate 101 without any pattern collapse.

When a resist pattern which dissolves in alcohol is formed, water cannot be substituted by alcohol after a formed fine pattern is rinsed with water. In this case, a surfactant (surface-active agent) is used to emulsify an aliphatic hydrocarbon with water or emulsify water with an aliphatic hydrocarbon. Using the surfactant allows substituting water by an aliphatic hydrocarbon after a resist pattern is formed and rinsed with water.

The surfactant is an amphiphile consisting of a hydrocarbon chain as a lipophilic group, and a hydrophilic group such as a polar group, and causes prominent adsorption on the oil-water interface. For this reason, water rinsing of a resist pattern uses surfactant-dissolved water or a surfactant-dissolved aliphatic hydrocarbon. This enables substituting water by an aliphatic hydrocarbon after a formed fine pattern is rinsed with water. When a surfactant is added to the aliphatic hydrocarbon, but the surfactant in use does not dissolve in liquid carbon dioxide, the surfactant remains on a substrate (pattern). In this case, before liquid carbon dioxide is introduced, the substrate is cleaned with a pure aliphatic hydrocarbon in which surfactant is contained.

A usable kind of surfactant is a nonionic surfactant which easily dissolves in an organic solvent, and emulsifies water by hydrating an OH group or the like in the molecular structure. Considering hydrophilic nature, a surfactant having ether bonds in a molecular structure is suitable. For example, a surfactant containing polyoxyethylene is suited. In particular, a polyoxyalkylenealkyl ether such as polyoxyethylenenonyl phenol ether (polyethylene glycol mononylphenyl ether) is excellent in emulsification of water with an aliphatic hydrocarbon.

A sorbitan fatty acid ester such as sorbitan monolaurate or sorbitan monostearate ester can also be used as a surfactant. A sorbitan fatty acid ester is inferior in emulsification of water with an aliphatic hydrocarbon to a polyoxyalkylenealkyl ether, but hardly influences polar resist polymers in an aliphatic hydrocarbon to which a sorbitan fatty ester is added. A polyoxyalkylenealkyl ether-based surfactant changes to a micelle structure when water is emulsified, and thus polar polymers become soluble. To the contrary, a sorbitan-based surfactant similarly forms micelles, but the HLB (Hydrophilic-lipophilic valance: ratio of hydrophilic groups in a surfactant) is low, and polar polymers do not become soluble. The HLB of polyoxyethylenenonyl phenol ether is 10.8, whereas that of sorbitan monolaurate is 8.6. Basically, the HLB is preferably 10 or more. However, when the emulsification effect is weak with a surfactant having an HLB of 10 or less, a surfactant mixture prepared by adding a small amount of high-HBL surfactant to a low-HBL surfactant can be used to enhance the emulsification effect. This is, e.g., a surfactant prepared by adding 5% polyoxyethylenenonyl phenol ether to sorbitan monolaurate. The usable surfactant is not limited to them, and a fatty acid ester-based nonionic surfactant such as polyoxyethylene sorbitan fatty acid ester can also be used.

EXAMPLE 2

Supercritical drying of Example 2 using the supercritical drying apparatus in FIG. 1 will be explained.

Figure 4A:
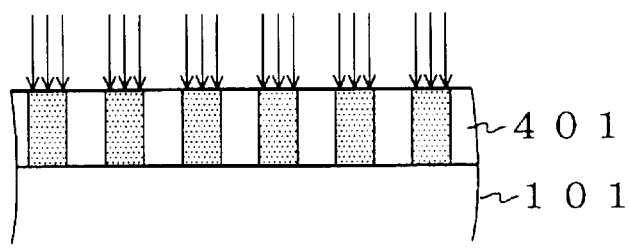
FIGS. 4A to 4F are sectional views for explaining Example 2 of the supercritical drying method according to Embodiment 1 of the present invention.
Figure 4B:
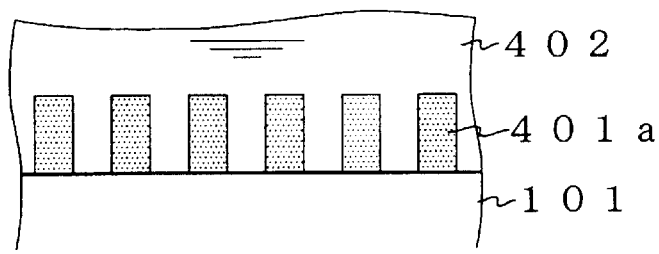

As shown in FIG. 4A, an electron beam resist thin film 401 made of NEB-31 (available from Sumitomo Chemical Inc.) applied to a substrate 101 was exposed to an electron beam to form a latent image of a desired pattern. As shown in FIG. 4B, the substrate 101 was dipped in a developing solution 402 consisting of a 2.38% aqueous tetramethylammonium hydroxide solution to develop the latent image, thereby forming resist patterns 401a on the substrate 101. The resist patterns 401a were formed with a width of 30 nm and a height of 150 nm, and the interval between adjacent patterns was set to 30 nm.

Figure 4C:
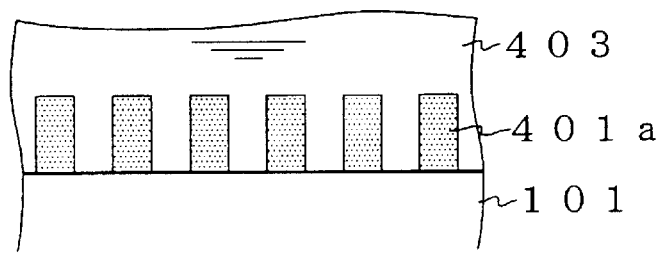
Figure 4D:
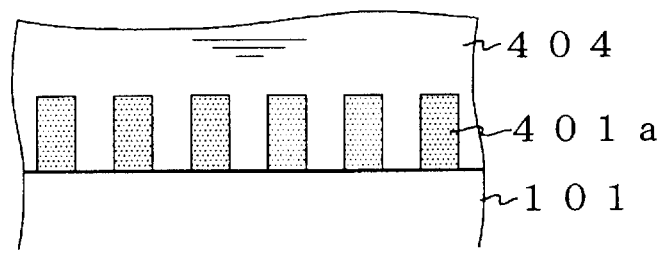

As shown in FIG. 4C, the substrate 101 was dipped in water 403 to stop developing, cleaned, and then fixed in a reaction chamber 102 (FIG. 1) filled with n hexane to which sorbitan monolaurate was added by 3% (weight ratio). The reaction chamber 102 is made so as to maintain high pressure. The substrate 101 was moved to the reaction chamber 102 so as to dry water on the surface of the substrate 101 before treating the substrate 101 with any solution. As shown in FIG. 4D, the substrate 101 was dipped in n-hexane 404 to which sorbitan monolaurate was added. Consequently, water on the surface of-the resist pattern 401a was emulsified with the n-hexane 404 owing to the presence of sorbitan monolaurate, and water was removed from the vicinity of the resist patterns 401a, i.e., the surface of the substrate 101.

Figure 4E:
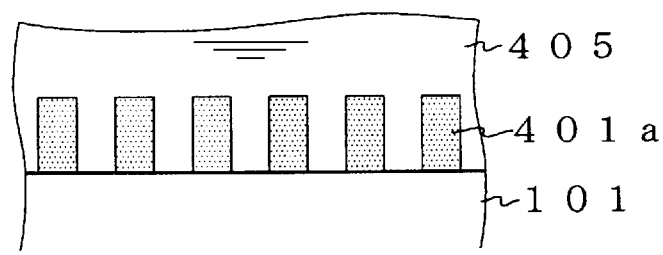

The reaction chamber 102 was sealed, and liquid carbon dioxide was introduced from a cylinder 103 shown in FIG. 1 into the reaction chamber 102 to substitute n-hexane. As shown in FIG. 4E, the substrate 101 was dipped in liquid carbon dioxide 405. Accordingly, the resist pattern 401a was dipped in the liquid carbon dioxide 405, and the n-hexane 404 on the surface of the substrate 101 was substituted by the liquid carbon dioxide 405.

Then, the supply pressure of liquid carbon dioxide by a pump unit 104, the discharge amount of carbon dioxide from the reaction chamber 102 by a pressure control valve 107, and the internal temperature of the reaction chamber 102 by a temperature controller 108 were adjusted. The internal pressure of the reaction chamber 102 was set to 7.5 MPa and the internal temperature of the reaction chamber 102 was set to 35° C. As a result, carbon dioxide in the reaction chamber 102 changed to the supercritical state.

Figure 4F:
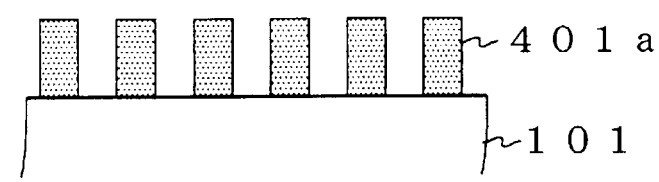

After carbon dioxide in the reaction chamber 102 changed to the supercritical state, supercritical carbon dioxide in the reaction chamber 102 was discharged at a rate of 0.5 l/min, and the substrate 101 in the reaction chamber 102 was dried. As shown in FIG. 4F, the substrate 101 having the fine resist patterns 401a was dried without any pattern collapse. In this case, the discharge rate of supercritical carbon dioxide was set to 0.5 l/min to make a pressure change in the reaction chamber gradual, and pattern collapse by an abrupt pressure change was suppressed. When liquid carbon dioxide was introduced, it substituted n-hexane to which sorbitan monolaurate was added, and almost no water remained. This can suppress pattern swelling caused by water left in the resist pattern in supercritical drying with supercritical carbon dioxide.

Note that Example 1 has exemplified the case wherein a silicon pattern is dried, but the present invention is not limited to this and can also be applied to a pattern made of another compound semiconductor. Further, the present invention is not limited to the resist pattern used in Example 2, and can also be applied to a pattern made of another polymer material. Also, the supercritical fluid is not limited to carbon dioxide, and a supercritical fluid of a nonpolar substance such as ethane or propane may be used.

EXAMPLE 3

When a biological specimen is to be observed with a scanning type electron microscope, the biological specimen must be dried. Drying of a biological specimen can also be realized by supercritical drying. In supercritically drying a biological specimen, a biological specimen in water was extracted, and dipped in a 5% n-hexane solution of polyoxyethylenenonyl phenol ether to substitute water by the hexane solution. After the biological specimen was rinsed with a pure hexane solution, the biological specimen was set and fixed in a reaction chamber 102 of the supercritical drying apparatus shown in FIG. 1, and liquid carbon dioxide was introduced into the reaction chamber 102. After hexane was substituted by liquid carbon dioxide and discharged from the reaction chamber 102, the internal pressure and temperature of the reaction chamber 102 were respectively set to 7.5 MPa and 35° C., and carbon dioxide in the reaction chamber 102 was changed to the supercritical state. While the temperature was kept at 35° C., supercritical carbon dioxide was discharged from the reaction chamber 102 at a rate of 1 l/min. With this operation, a dried biological specimen can be obtained with little deformation, compared to alcohol substitution.

Embodiment 2

Embodiment 2 of the present invention will be described.

Carbon dioxide does not have any polar moment, and hardly dissolves water which is a representative of a polar molecule. Even at a high pressure, the Van der Waals force of carbon dioxide is generally lower than that of a hydrocarbon solvent, and hardly dissolves water. In this embodiment, a surfactant (surface-active agent) is added to liquid carbon dioxide to attain a state in which water disperses (is emulsified) in liquid carbon dioxide and dissolves in a pseudo manner, and water attached to a substrate surface upon rinsing with water is substituted by liquid carbon dioxide.

A supercritical drying method in this embodiment using surfactant-added liquid carbon dioxide will be explained. As shown in FIG. 5A, after a substrate 501 having patterns 501a is dipped in water 502 and rinsed with water, the substrate 501 is placed in a reaction chamber constituting a predetermined sealable vessel. Surfactant-added liquid carbon dioxide is introduced into the reaction chamber, and the substrate 501 is dipped in surfactant-added liquid carbon dioxide 503, as shown in FIG. 5B. Introduction of the surfactant-added liquid carbon dioxide 503 into the reaction chamber and discharge of the liquid carbon dioxide waste may be repeated, or the liquid carbon dioxide 503 may be continuously introduced into and discharged from the reaction chamber. With these steps, water attached around each pattern 501a is emulsified with liquid carbon dioxide to attain a state in which the liquid carbon dioxide 503 attaches to the pattern 501a. That is, water is substituted by surfactant-added liquid carbon dioxide.

Subsequently, the internal pressure of the reaction chamber, i.e., the pressure around the substrate 501 and pattern 501a is set to 7.5 MPa. In addition, the temperature of liquid carbon dioxide is set to 31° C. to obtain the supercritical state. As shown in FIG. 5C, the substrate 501 is dipped in supercritical carbon dioxide 504. If the internal pressure of the reaction chamber is decreased to gasify supercritical carbon dioxide, the substrate 501 having the patterns 501a can be dried without any pattern collapse, as shown in FIG. 5D. Note that the supercritical state also includes a subcritical state. This also applies to the following description.

The surfactant will be explained. As described above, carbon dioxide hardly dissolves water even at a high pressure. To the contrary, for example, a low-polarity fluorinated polymer represented by perfluorocarbon is known as a $CO_2$-philic substance. Perfluoropolyether, in which several oxygen molecules are bonded between carbon chains is also known as a $CO_2$-philic substance, and dissolves in carbon dioxide. A polymer containing silicon such as polysiloxane is also a $CO_2$-philic substance.

If hydrophilic groups such as carboxyl groups are bonded to the terminals of these polymers, the surfactant changes such that the hydrophilic group part attains affinity for water, and the fluorinated polymer part attains affinity for carbon dioxide. This surfactant surrounds water molecules to form a micelle structure, dissolves in carbon dioxide, and acts as a bridge between supercritical carbon dioxide and organic molecules in water.

The present inventors have confirmed that the above surfactant has high affinity for water, and does not exhibit any adverse effect of dissolving resist polymers, unlike a popular amphoteric surfactant (e.g., polyethylene glycol mononononylphenyl ether).

Any surfactant can be adopted as far as the main chain contains $CF_2$, $CF_2O$, or $Si(CH_3)_2O$ having $CO_2$-philic groups, and the terminal has a hydrophilic group such as —COOH, —OH, —$SO_3H$, —CHO, or —$NH_2$. The end group may be ionic as, e.g., $COO^-NH_4^+$. The representative is "carboxylate perfluoropolyether" (tradename "Kritox": available from DU PONT) such as $F^-(CF_2CF (CF_3)O)_n$— $CF_2CF_2COOH$.

A supercritical drying apparatus for performing supercritical drying will be described. In the supercritical drying apparatus, as shown in FIG. 6, liquid carbon dioxide is introduced from a cylinder 601 storing liquid carbon dioxide into a reaction chamber 605 via a valve 602 and an inlet port 604 of a sealable vessel 603. The reaction chamber 605 has a discharge port 606 from which internal liquid carbon dioxide or the like can be discharged. The discharge port 606 has a valve 607 which can control the amount of liquid carbon dioxide to be discharged. In addition, the supercritical drying apparatus comprises a tank 608 storing a solution of a predetermined surfactant. The tank 608 is connected parallel between the cylinder 601 and the vessel 603 (inlet port 604). A valve 609 is arranged between the cylinder 601 and the tank 608.

In the supercritical drying apparatus, liquid carbon dioxide in the cylinder 601 can be introduced into the reaction chamber 605 by closing the valve 609 and opening the valve 602. By closing the valve 602 and opening the valve 609, liquid carbon dioxide can be introduced into the reaction chamber 605 after a surfactant in the tank 608 is dissolved in liquid carbon dioxide stored in the cylinder 601. The vessel 603 comprises a temperature control means 610 which can control the internal temperature of the reaction chamber 605 to, e.g., 31° C.

The supercritical drying apparatus can control the opening/closing degree of the valve 607 to control the internal pressure of the reaction chamber 605 while introducing liquid carbon dioxide from the cylinder 601 into the reaction chamber 605. If the valve 602 is closed, the valve 609 is opened, and the opening/closing degree of the valve 607 is controlled, surfactant-added liquid carbon dioxide can be introduced into the reaction chamber 605. In this state, if the opening/closing degree of the valve 607 of the discharge port 606 is decreased, the internal pressure of the reaction chamber 605 is set to 7.38 MPa or more, and the internal temperature of the reaction chamber 605 is set to about 31° C., liquid carbon dioxide in the reaction chamber 605 can change to the supercritical state.

After carbon dioxide in the reaction chamber 605 changes to the supercritical state in this manner, the valve 609 is closed in addition to the valve 602. Then, no liquid carbon dioxide is supplied to the reaction chamber 605, and carbon dioxide is only discharged via the discharge port 606. As a result, the internal pressure of the reaction chamber 605 decreases, and supercritical carbon dioxide in the reaction chamber 605 gasifies.

As described above, this supercritical drying apparatus can execute supercritical drying shown in FIG. 5 in which surfactant-added liquid carbon dioxide is introduced into the reaction chamber 605, the introduced liquid carbon dioxide is changed to the supercritical state, and the supercritical carbon dioxide is gasified. In this structure, liquid carbon dioxide from the cylinder 601 may be supplied under pressure by a pressure pump, and the discharge side of the reaction chamber may be controlled under pressure by an automatic pressure valve.

Figure 7:
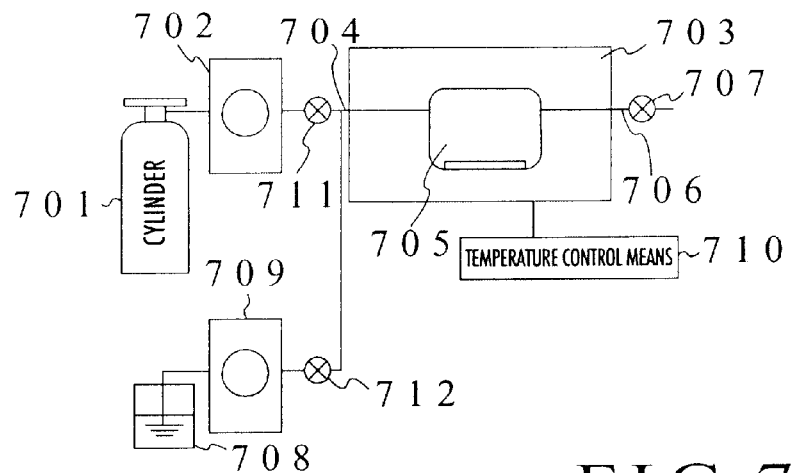
FIG. 7 is a view showing another arrangement of the supercritical drying apparatus for performing the supercritical drying method according to Embodiment 2 of the present invention.

A supercritical drying apparatus having another arrangement for performing supercritical drying will be described. In the supercritical drying apparatus, as shown in FIG. 7, a pressure pump 702 introduces liquid carbon dioxide from a cylinder 701 storing liquid carbon dioxide into a reaction chamber 705 via an inlet port 704 of a sealable vessel 703. The reaction chamber 705 has a discharge port 706 from which internal liquid carbon dioxide or the like can be discharged. The discharge port 706 has a valve 707 which can control the amount of liquid carbon dioxide to be discharged.

If the valve 707 is an automatic pressure valve, the automatic pressure valve and pressure pump can be used to continuously supply liquid carbon dioxide to the reaction chamber 705 while keeping the interior of the reaction chamber 705 in a pressure state which allows the presence of liquid carbon dioxide.

The supercritical drying apparatus comprises a tank 708 storing a solution of a predetermined surfactant, and introduces the solution of the surfactant in the tank 708 into the reaction chamber 705 via the inlet port 704 by a pressure pump 709.

A valve 711 is arranged between the pressure pump 702 and the inlet port 704, whereas a valve 712 is arranged between the pressure pump 709 and the inlet port 704.

In the supercritical drying apparatus, liquid carbon dioxide in the cylinder 701 can be supplied under pressure to the reaction chamber 705 by closing the valve 712, opening the valve 711, and operating the pressure pump 702. By opening the valve 712 in addition to the valve 711, and operating the pressure pump 709, the surfactant in the tank 708 can be added to liquid carbon dioxide supplied under pressure to the reaction chamber 705 without decreasing the pressure. The vessel 703 comprises a temperature control means 710 which can control the internal temperature of the reaction chamber 705 to, e.g., 31° C.

The supercritical drying apparatus can control the opening/closing degree of the valve 707 to control the internal pressure of the reaction chamber 705 while supplying liquid carbon dioxide under pressure to the reaction chamber 705 by the pressure pump 702. Hence, surfactant-added liquid carbon dioxide can be introduced into the reaction chamber 705 by opening the valves 711 and 712, operating the pressure pumps 702 and 709, and controlling the opening/closing degree of the valve 707. In this state, if the opening/closing degree of the valve 707 of the discharge port 706 is decreased, the internal pressure of the reaction chamber 705 is set to 7.38 MPa or more, and the internal temperature of the reaction chamber 705 is set to about 31° C., liquid carbon dioxide in the reaction chamber 705 can change to the supercritical state.

After carbon dioxide in the reaction chamber 705 changes to the supercritical state in this manner, the operation of the pressure pumps 702 and 709 is stopped, and the valves 711 and 712 are closed. Then, no liquid carbon dioxide is supplied to the reaction chamber 705, and carbon dioxide is only discharged via the discharge port 706. Consequently, the internal pressure of the reaction chamber 705 decreases, and supercritical carbon dioxide in the reaction chamber 705 gasifies.

As described above, this supercritical drying apparatus can also execute supercritical drying shown in FIG. 5 in which surfactant-added liquid carbon dioxide is introduced into the reaction chamber 705, the introduced liquid carbon dioxide is changed to the supercritical state, and the supercritical carbon dioxide is gasified.

Embodiment 3

Still another embodiment of the present invention will be described.

As described in Embodiment 2, a surfactant may remain on a pattern on a substrate after water on the substrate is substituted by surfactant-added liquid carbon dioxide, and liquid carbon dioxide is changed to the supercritical state.

Figure 8A:
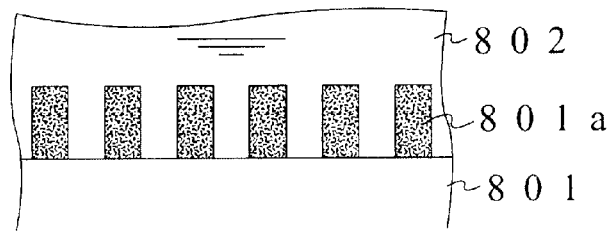
Figure 8B:
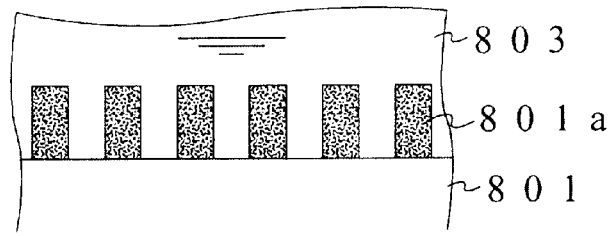

After a substrate 801 having patterns 801a is dipped in water 802 and rinsed with water, as shown in FIG. 8A, the substrate 801 is dipped in surfactant-added liquid carbon dioxide 803 in a reaction chamber constituting a predetermined sealable vessel, thereby substituting water by surfactant-added liquid carbon dioxide, as shown in FIG. 8B.

Figure 8C:
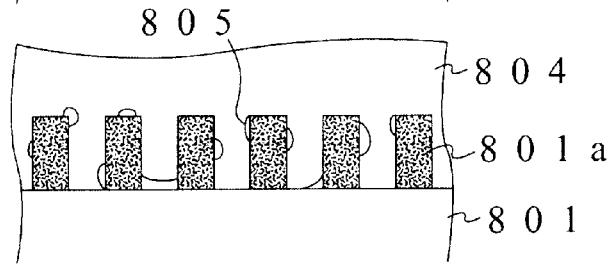
Figure 8D:
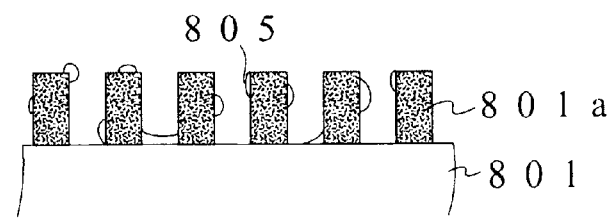

The pressure around the substrate 801 and patterns 801a is set to 7.5 MPa. In addition, the temperature of liquid carbon dioxide is set to 31° C. to obtain the supercritical state. The substrate 801 is dipped in supercritical carbon dioxide 804, as shown in FIG. 8C. At this time, a surfactant 805 is deposited on the surface of each pattern 801a. Even after supercritical carbon dioxide is gasified, the surfactant 805,may remain on the pattern 801a.

This is because of the solubility difference of the surfactant between liquid carbon dioxide and supercritical carbon dioxide.

The surfactant dissolved in liquid carbon dioxide forms a micelle state in which the hydrophilic group of the surfactant is bonded to water, and the $CO_2$-philic group of the surfactant is exposed around the bond. This surfactant entraps water in liquid carbon dioxide. The surfactant itself dissolves in liquid carbon dioxide. However, when liquid carbon dioxide is changed to the supercritical state, the concentration decreases to about ½, which decreases the solubility of the surfactant. The concentration of liquid carbon dioxide is 800 g/l, whereas that of supercritical carbon dioxide is 468 g/l. When the concentration of the surfactant dissolved in liquid carbon dioxide is supersaturated for supercritical carbon dioxide, the excess surfactant is deposited after liquid carbon dioxide is changed to the supercritical state.

Figure 9A:
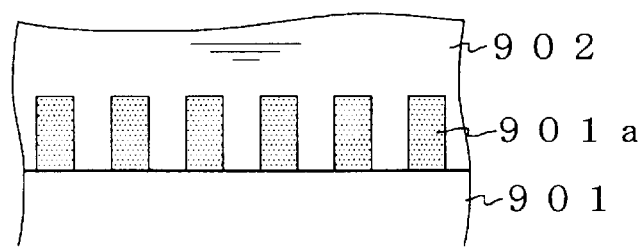
FIGS. 9A to 9D are sectional views for explaining still another example of the supercritical drying method according to Embodiment 2 of the present invention.

To solve this problem, it is good to decrease the concentration of the surfactant in liquid carbon dioxide before carbon dioxide becomes a supercritical state. At first, a substrate having a pattern is dipped in and rinsed with water. Then, as shown in FIG. 9A, a substrate 901 is dipped in surfactant-added liquid carbon dioxide 902 in a reaction chamber constituting a predetermined sealable vessel. Introduction of the surfactant-added liquid carbon dioxide 902 into the reaction chamber and discharge of the liquid carbon dioxide waste may be repeated, or the surfactant-added liquid carbon dioxide 902 may be continuously introduced into and discharged from the reaction chamber. With these steps, water attached around each pattern 901a is emulsified with liquid carbon dioxide to attain a state in which the liquid carbon dioxide 902 attaches to the pattern 901a. That is, water is substituted by surfactant-added liquid carbon dioxide.

Figure 9B:
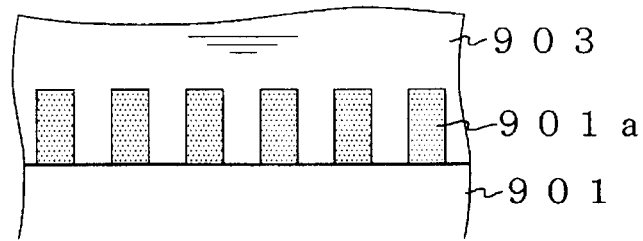

Then, liquid carbon dioxide to which no surfactant is added is introduced into the reaction chamber to set a state in which the atmosphere of the substrate 901 having the patterns 901a contains only liquid carbon dioxide 903 in which no surfactant is dissolved, as shown in FIG. 9B. At this time, the concentration of the surfactant in liquid carbon dioxide in the atmosphere of the patterns 901a may be set to a predetermined value or less. In this fashion, before the supercritical state is set, the concentration of the surfactant dissolved in liquid carbon dioxide is decreased, or the surfactant is eliminated. Accordingly, deposition of the surfactant in the supercritical state can be suppressed or eliminated.

Figure 9C:
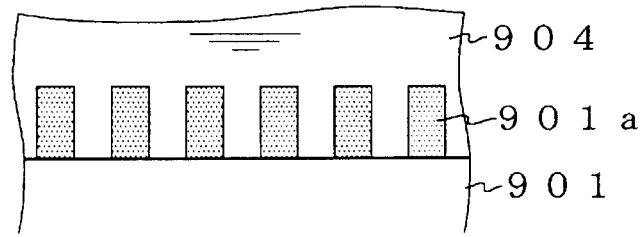
Figure 9D:
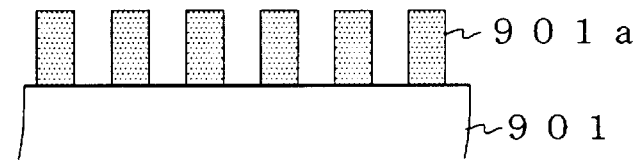

After that, the internal pressure of the reaction chamber, i.e., the pressure around the substrate 901 and pattern 901a is set to 7.5 MPa. In addition, the temperature of liquid carbon dioxide is set to 31° C. to set the supercritical state. As shown in FIG. 9C, the substrate 901 is dipped in supercritical carbon dioxide 904. If the internal pressure of the reaction chamber is decreased to gasify supercritical carbon dioxide, the substrate 901 having the pattern 901a can be dried without depositing any surfactant on the pattern 901a and without any pattern collapse, as shown in FIG. 9D.

This can be realized by the supercritical drying apparatuses in FIGS. 6 and 7. With the use of the supercritical drying apparatus in FIG. 6, surfactant-added liquid carbon dioxide can be introduced into a reaction chamber 605 by closing a valve 602, opening a valve 609, and controlling the opening/closing degree of a valve 607. Then, liquid carbon dioxide to which no surfactant is added is introduced into the reaction chamber 605 by closing the valve 609 and opening the valve 602. This can decrease the concentration of the surfactant in liquid carbon dioxide in the reaction chamber 605, and eliminate the surfactant. Thereafter, the opening/closing degree of the valve 607 of a discharge port 606 is decreased, the internal pressure of the reaction chamber 605 is set to 7.5 MPa or more, and the internal temperature of the reaction chamber 605 is set to about 31° C. Then, liquid carbon dioxide can change to the supercritical state without depositing any surfactant in the reaction chamber 605.

In the supercritical drying apparatus of FIG. 6, the distal end of a liquid carbon dioxide inlet pipe in a tank 608 may not be inserted into the surfactant in the tank 608.

In this structure of the tank 608, if liquid carbon dioxide is abruptly introduced into the tank 608, the surfactant may splash owing to a pressure difference, and a mass of the splashing liquid may enter the reaction chamber 605 through the pipe. To prevent this, a porous material or filter paper in the tank 608 is preferably impregnated with the surfactant. Alternatively, the following operation is also possible. That is, the valve 609 is closed, the valve 602 is opened, and carbon dioxide is supplied under pressure until the reaction chamber 605 and tank 608 are set to predetermined pressures, thereby eliminating the pressure difference. Then, the valve 602 is closed, the valve 609 is opened, and surfactant-added liquid carbon dioxide is introduced into the reaction chamber 605.

Figure 10A:
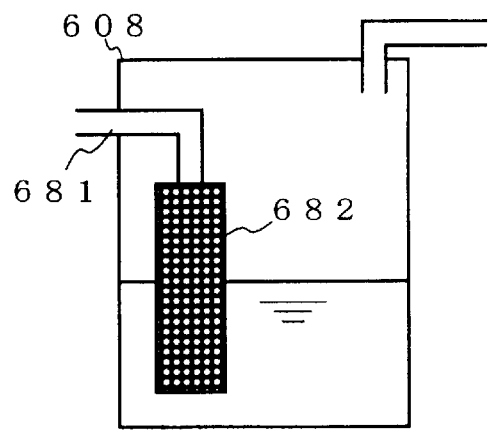
FIGS. 10A and 10B are sectional views each showing a partial arrangement of the supercritical drying apparatus for performing the supercritical drying method according to Embodiment 2 of the present invention.
Figure 10B:
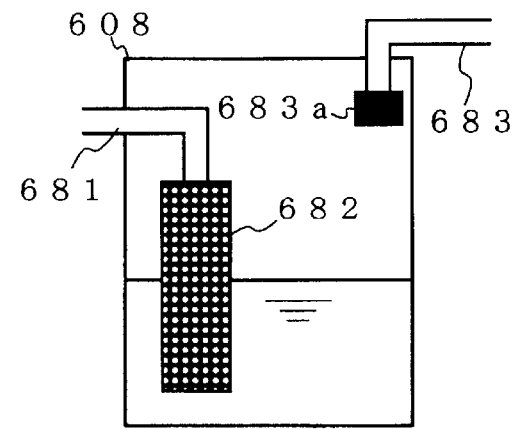

As shown in FIGS. 10A and 10B, a perforated pipe 682 having many small apertures may be attached to the distal end of a pipe 681 through which liquid carbon dioxide is supplied into the tank 608. By dipping the distal end of the perforated pipe 682 in the solution of the surfactant stored in the tank 608, liquid carbon dioxide flowing out from many apertures of the perforated pipe 682 in many directions efficiently dissolves the surfactant. Furthermore, the interiors of the perforated pipe 682 and tank 608 which are not dipped in the solution of the surfactant communicate with each other via the apertures, so that the internal pressures of the perforated pipe 682 and tank 608 become equal to each other. This can exclude the danger of pressurizing the interior of the tank 608 and reversely flowing the solution of the surfactant through the perforated pipe 682 and pipe 681.

The perforated pipe 682 may be made of a porous material, or a cylindrical member having a plurality of apertures.

As shown in FIG. 10B, the distal end of a pipe 683 in the tank 608 may have a perforated structure 683a having many apertures on the discharge side of the tank 608. This can suppress entrance of a mass of the surfactant generated in the tank 608 into the reaction chamber via the pipe 683.

This embodiment will be explained in detail by way of examples.

EXAMPLE 4

Example 4 will be described. An electron beam resist NEB-31 (available from Sumitomo Chemical Inc.) was applied to a silicon substrate by spin coating, forming a resist film to a film thickness of 200 nm. The resist film was exposed to an electron beam with a predetermined pattern image, and developed with an aqueous 2.38% tetramethylammonium hydroxide (TMAH) solution to form desired resist patterns on the silicon substrate. An array of resist patterns was formed with a pattern width of 50 to 200 nm.

After the silicon substrate was rinsed with water, the silicon substrate wet with water was placed in the reaction chamber of a sealed vessel set to an internal temperature of 23° C., and liquid carbon dioxide was introduced into the reaction chamber to a pressure of 7.5 MPa. Liquid carbon dioxide was introduced by a pressure pump. After liquid carbon dioxide was introduced, a selector valve was switched to introduce liquid carbon dioxide into the reaction chamber under pressure via a path running through a tank storing carboxylate perfluoropolyether (Kritox, available from DU PONT) as a surfactant. At this time, the internal pressure of the reaction chamber was fixed to 7.5. MPa using an automatic pressure valve.

After surfactant-added liquid carbon dioxide was supplied under pressure to the reaction chamber for 1 h at a flow rate of 10 ml/min, the inlet path was switched to introduce only liquid carbon dioxide into the reaction chamber for 30 min. Subsequent to introduction of only liquid carbon dioxide, while the internal pressure of the reaction chamber was held at 7.5 MPa, the internal temperature of the reaction chamber was increased to 35° C., and liquid carbon dioxide filled in the reaction chamber was changed to the supercritical state. After liquid carbon dioxide in the reaction chamber changed to the supercritical state, carbon dioxide in the reaction chamber was externally discharged at a rate of 1 l/min to set the interior of the reaction chamber to the atmospheric pressure while the temperature of the reaction chamber was fixed to 35° C. Then, supercritical carbon dioxide in the reaction chamber was gasified to end drying of the substrate placed in the reaction chamber. Any patterns having different widths on the dried substrate were free from collapse.

EXAMPLE 5

Example 5 will be described.

An electron beam resist NEB-31 was applied to a silicon substrate by spin coating, forming a resist film to a film thickness of 200 nm. The resist film was exposed to an electron beam with a predetermined pattern image, and developed with an aqueous 2.38% TMAH solution to form desired resist patterns on the silicon substrate. An array of resist patterns was formed with a pattern width of 50 to 200 nm.

After the silicon substrate was rinsed with water, the silicon substrate was placed in the reaction chamber of a sealed vessel set to an internal temperature of 23° C., and liquid carbon dioxide to which a surfactant (Kritox) was added was introduced under pressure into the reaction chamber. The surfactant was supplied under pressure by a pressure pump midway along a path for introducing liquid carbon dioxide by the pressure pump into the reaction chamber, thereby adding the surfactant to liquid carbon dioxide. The internal pressure of the reaction chamber was adjusted to 7.5 MPa using an automatic pressure valve. After liquid carbon dioxide was supplied under pressure for 1 h at a flow rate of 10 ml/min, the inlet path was switched to introduce only liquid carbon dioxide into the reaction chamber for 30 min.

Subsequent to introduction of only liquid carbon dioxide, while the internal pressure of the reaction chamber was held at 7.5 MPa, the internal temperature of the reaction chamber was increased to 35° C., and liquid carbon dioxide filled in the reaction chamber was changed to the supercritical state. After liquid carbon dioxide in the reaction chamber changed to the supercritical state, carbon dioxide was externally discharged at a rate of 1 l/min to set the interior of the reaction chamber to the atmospheric pressure while the internal temperature of the reaction chamber was fixed to 35° C. Then, supercritical carbon dioxide in the reaction chamber was gasified to end drying of the substrate placed in the reaction chamber. Any patterns having different widths on the dried substrate were free from collapse.

EXAMPLE 6

Example 6 will be described.

An electron beam resist SAL-601 (available from Shipley) was applied to a silicon substrate by spin coating, forming a resist film to a film thickness of 200 nm. The resist film was exposed to an electron beam with a predetermined pattern image. The substrate was placed in a reaction chamber controlled to 23° C. An aqueous 2.38% TMAH solution was introduced into the sealed reaction chamber, and the pattern image was developed to form desired resist patterns on the silicon substrate. After the developing solution was discharged from the reaction chamber, water was introduced to rinse the substrate with water.

After water was discharged from the reaction chamber, liquid carbon dioxide to which ammonium carboxylate perfluoropolyether was added as a surfactant was introduced under pressure into the reaction chamber at a flow rate of 10 ml/min for 30 min while water remained on the substrate. This introduction emulsified water on the substrate into liquid carbon dioxide, thereby substituting water on the substrate into liquid carbon dioxide. After water on the substrate was substituted by liquid carbon dioxide, the inlet path was switched to introduce only liquid carbon dioxide into the reaction chamber for 30 min.

Subsequent to introduction of only liquid carbon dioxide, while the internal pressure of the reaction chamber was held at 7.5 MPa, the internal temperature of the reaction chamber was increased to 35° C., and liquid carbon dioxide filled in the reaction chamber was changed to the supercritical state. While the internal temperature of the reaction chamber was fixed to 35° C., carbon dioxide was externally discharged at a rate of 1 ml/min to set the interior of the reaction chamber to the atmospheric pressure. Then, supercritical carbon dioxide in the reaction chamber was gasified to end drying of the substrate placed in the reaction chamber. Any patterns having different widths on the dried substrate were free from collapse.

Note that the above examples used perfluoropolyether as a surfactant, but the surfactant is not limited to this. Any surfactant can be applied as far as the main chain forming a surfactant consists of molecules which dissolve in carbon dioxide, and the end group of the main chain has a polar group having affinity for water. Also, the resist is not limited to those described in the above examples, and the present invention can be applied to all resists which undergo water rinsing. Moreover, the present invention can be applied to pattern drying of, e.g., a silicon or compound semiconductor thin film other than the resist.

As has been described above, the present invention uses a surfactant to substitute water attached to a pattern by a liquid and substitute a liquid by a nonpolar substance. Accordingly, the present invention can efficiently remove water from a pattern layer, and attains an excellent effect of more rapidly performing supercritical drying which suppresses generation of pattern collapse.

What is claimed is:

1. A supercritical drying method comprising at least:
   the first step of exposing a pattern layer having a predetermined pattern formed on a substrate to water;
   the second step of exposing the pattern layer to a predetermined liquid after the first step while the water attaches to the pattern layer, emulsifying the water attached to the pattern layer with the predetermined liquid, and obtaining a state in which the predetermined liquid attaches to the pattern layer;
   the third step of substituting the predetermined liquid attached to the pattern layer by a liquid of a nonpolar substance that is gaseous in an atmospheric pressure;
   the fourth step of changing the nonpolar substance attached to the pattern layer to a supercritical state after the third step; and
   the fifth step of gasifying the supercritical nonpolar substance attached to the pattern layer after the fourth step.

2. A method according to claim 1, wherein the nonpolar substance comprises carbon dioxide.

3. A method according to claim 1, wherein the predetermined liquid comprises a surfactant-added nonpolar aliphatic hydrocarbon.

4. A method according to claim 1, wherein the predetermined liquid comprises a nonpolar aliphatic hydrocarbon, and the water contains a surfactant.

5. A method according to claim 1, wherein the predetermined liquid comprises the surfactant-added nonpolar liquid.

6. A method according to claim 3, wherein the surfactant comprises a nonionic surfactant.

7. A method according to claim 3, wherein the surfactant contains fluorine or silicon.

8. A method according to claim 3, wherein the surfactant comprises one of perfluorocarbon and perfluoropolyether having a hydrophilic group at a terminal.

9. A method according to claim 3, wherein the surfactant comprises polysiloxane having a hydrophilic group at a terminal.

10. A method according to claim 5, wherein the surfactant comprises a nonionic surfactant.

11. A method according to claim 5, wherein the surfactant contains fluorine or silicon.

12. A method according to claim 5, wherein the surfactant comprises perfluorocarbon having a hydrophilic group at a terminal.

13. A method according to claim 5, wherein the surfactant comprises perfluoropolyether having a hydrophilic group at a terminal.

14. A method according to claim 5, wherein the surfactant comprises polysiloxane having a hydrophilic group at a terminal.

15. A method according to claim 1, wherein the supercritical state includes a subcritical state.

16. A method according to claim 4, wherein the aliphatic hydrocarbon comprises normal hexane.

17. A method according to claim 4, wherein the aliphatic hydrocarbon comprises normal heptane.

18. A method according to claim 5, wherein the third step comprises exposing the pattern layer to the liquid of the nonpolar substance not containing the surfactant, and decreasing a concentration of the surfactant in the liquid of the nonpolar substance attached to the pattern layer, and then the fourth step is performed.

19. A method according to claim 5, further comprising the steps of:
   before the second step, exposing the pattern layer to a liquid of the nonpolar substance to which the surfactant is not added while the water attaches to the pattern layer; and
   exposing the pattern layer to a liquid of the surfactant-added nonpolar substance.

20. A method according to claim 1, wherein all the steps are performed in a single vessel.

21. A method according to claim 18, wherein all the steps are performed in a single vessel.

22. A method according to claim 19, wherein all the steps are performed in a single vessel.

23. A supercritical drying method comprising at least:
   the first step of exposing a pattern layer having a predetermined pattern formed on a substrate to water;
   the second step of exposing the pattern layer to a nonpolar aliphatic hydrocarbon liquid after the first step while the water attaches to the pattern layer, emulsifying the water attached to the pattern layer and the aliphatic hydrocarbon liquid, and obtaining a state in which the aliphatic hydrocarbon liquid attaches to the pattern layer;
   the third step of exposing the pattern layer to a liquid of a nonpolar substance that is gaseous in an atmospheric pressure while the aliphatic hydrocarbon liquid attaches to the pattern layer, dissolving the aliphatic hydrocarbon liquid attached to the pattern layer in the liquid of the nonpolar substance, and obtaining a state in which the liquid of the nonpolar substance attaches to the pattern layer;
   the fourth step of changing the nonpolar substance attached to the pattern layer to a supercritical state after the third step; and
   the fifth step of gasifying the supercritical nonpolar substance attached to the pattern layer after the fourth step.

24. A method according to claim 23, wherein all the steps are performed in a single vessel.

* * * * *